US008675705B2

(12) United States Patent
Erbert et al.

(10) Patent No.: US 8,675,705 B2
(45) Date of Patent: Mar. 18, 2014

(54) DIODE LASER AND LASER RESONATOR FOR A DIODE LASER HAVING IMPROVED LATERAL BEAM QUALITY

(75) Inventors: Goetz Erbert, Berlin (DE); Martin Spreemann, Berlin (DE); Hans Wenzel, Berlin (DE); Joerg Fricke, Berlin (DE)

(73) Assignee: Forschungsverbund Berlin E.V., Berlin (DE)

( * ) Notice: Subject to any disclaimer, the term of this patent is extended or adjusted under 35 U.S.C. 154(b) by 0 days.

(21) Appl. No.: 13/390,837

(22) PCT Filed: Aug. 23, 2010

(86) PCT No.: PCT/EP2010/062256

§ 371 (c)(1), (2), (4) Date: Mar. 16, 2012

(87) PCT Pub. No.: WO2011/020923

PCT Pub. Date: Feb. 24, 2011

(65) Prior Publication Data

US 2012/0177077 A1 Jul. 12, 2012

(30) Foreign Application Priority Data

Aug. 21, 2009 (DE) ......................... 10 2009 028 823

(51) Int. Cl.
*H01S 5/125* (2006.01)

(52) U.S. Cl.
USPC ...................... 372/50.11; 372/43.01; 372/102

(58) Field of Classification Search
USPC ....................................................... 372/50.11
See application file for complete search history.

(56) References Cited

U.S. PATENT DOCUMENTS

| | | | | |
|---|---|---|---|---|
| RE35,215 | E | 4/1996 | Waarts et al. | |
| 5,592,503 | A * | 1/1997 | Welch et al. | 372/50.11 |
| 5,894,492 | A | 4/1999 | Welch et al. | |
| 6,064,685 | A * | 5/2000 | Bissessur et al. | 372/102 |
| 6,580,740 | B2 * | 6/2003 | Funabashi et al. | 372/50.22 |
| 2001/0048704 | A1 * | 12/2001 | Matsuda | 372/43 |
| 2006/0215720 | A1 * | 9/2006 | Corzine et al. | 372/50.11 |

OTHER PUBLICATIONS

Bedford et al., "Demonstration of Finite-Aperture Tapered Unstable Resonator Lasers", Applied Physics Letters, AIP. vol. 83, No. 5, Aug. 4, 2003.

Eriksson et al., "Surface-Emitting Unstable-Resonator Laser with Integrated Diffractive Beam-Forming Elements", IEEE Photonics Technology Letters, vol. 9, No. 12, Dec. 1, 1997.

(Continued)

*Primary Examiner* — Xinning Niu

(74) *Attorney, Agent, or Firm* — Norris McLaughlin & Marcus P.A.

(57) ABSTRACT

A diode laser and a laser resonator for a diode laser are provided, which has high lateral beam quality at high power output, requires little adjustment effort and is inexpensive to produce. The laser resonator according to the invention comprises a gain section (GS), a first planar Bragg reflector (DBR1) and a second planar Bragg reflector (DBR2), wherein the gain section (GS) has a trapezoidal design and the first planar Bragg reflector (DBR1) is arranged on a first base side of the trapezoidal gain section (GS) and the second planar Bragg reflector (DBR2) is arranged on the opposing base side of the trapezoidal gain section (GS), wherein the width (D1) of the first planar Bragg reflector (DBR1) differs from the width (D2) of the second planar Bragg reflector (DBR2).

16 Claims, 4 Drawing Sheets

(56) References Cited

OTHER PUBLICATIONS

Kristjansson S. et al., "Surface-Emitting Tapered Unstable Resonator Laser with Integrated Focusing Grating Coupler", IEEE Photonics Technology Letters, vol. 12, No. 10, Oct. 1, 2000.

Spreemann et al., "Novel Approach to Finite Aperture Tapered Unstable Resonator Lasers" IEEE Journal of Quantum Electronics, vol. 27, No. 1, Oct. 31, 2011.

International Search Report Dated Nov. 1, 2011, mailed Nov. 21, 2011.

* cited by examiner

DIODE LASER AND LASER RESONATOR FOR A DIODE LASER HAVING IMPROVED LATERAL BEAM QUALITY

This application is a 371 application of PCT/EP2010/062256 filed Aug. 23, 2010, which claims foreign priority benefit under 35 U.S.C. §119 of German application 10 2009 028 823.6 filed Aug. 21, 2009.

The present invention relates to a diode laser and laser resonator for a diode laser having improved lateral beam quality without using an external resonator; the present invention in particular relates to a broad area laser having high power output of >1 W. A broad area laser typically has a contact width of 10 μm to 500 μm and a resonator length of 0.5 mm to 10 mm.

STATE OF THE ART

Broad area lasers (BA lasers) achieve high power. Due to the great lateral extent of the waveguide, however, many lateral modes can be stimulated at the same time. In addition, the strong coupling of optical intensity and greater material thickness results in the formation of local waveguides, so called filaments. Both effects reduce spatial coherence and beam quality. There is a number of approaches aimed at enhancing optical power without reducing beam quality:

Lateral structuring of the current injection of a broad area laser or the coherent coupling of several narrow stripe lasers Lateral mode selection by means of "angle-dependent reflection", e.g. using tilted facets (tilted-cavity laser, TLC) or tilted Bragg reflectors (α-DFB laser)

Unstable laser resonators based on a) curved facets b) curved Bragg gratings

Monolithic combinations of a single-lateral-mode ridge waveguide laser (master oscillator) with a broad-surface, trapezoidal power amplifier to obtain a trapezoidal master oscillator power amplifier (MOPA) system Trapezoidal resonator design with integrated ridge waveguide as a lateral mode filter (trapezoidal laser)

In the first three aforesaid approaches, it was partly possible to achieve an improvement in beam quality for low power (<5 W), compared to conventional broad area lasers. However, these approaches did not achieve higher optical power, or when power was high, the lateral mode control mechanisms failed and beam quality was below that of conventional broad area lasers.

In case of an unstable laser resonator with curved facets, the main problem is that the roughness of the facets, which are etched in most cases, is too high. In case of curved Bragg gratings, it is difficult to properly adjust the phases of the partial waves that are reflected by the curved gratings. The radius of curvature of each individual grating trench must be different, resulting in a more complex manufacturing process.

The drawback of MOPA systems is that, while having the same overall length, the effective pump surface is significantly smaller, compared to broad area lasers. However, the electrical series resistance and the thermal resistance of a diode laser are anti-proportional to the pump surface. The degree of conversion, i.e. the ratio of optical power output to electric power supply, of a trapezoidal MOPA is therefore significantly below that of a BA laser. The power loss is released in the form of heat. At the same time, while the amount of heat produced is the same, the temperature in the trapezoidal MOPA increases more, due to the increased thermal resistance, and the temperature-dependent optical gain decreases more than in BA lasers. This effect is called thermal rollover and limits the optical power of trapezoidal MOPAs even at significantly lower pump currents than in BA lasers. Furthermore, astigmatism, i.e. the distance of the laser beam waists in the "fast axis" and "slow axis", strongly depends on the operating point (pump current & temperature). This means, an optical system behind the laser must have a different structure for different operating points. Moreover, even a minimal feedback of laser light from the front facet into the master oscillator will disturb stable operation of the laser and may cause undesirable pulsations and chaotic dynamic conditions.

Trapezoidal lasers can also be used to realize >5 W of power while significantly improving beam quality, compared to BA lasers. Except for the sensitivity to internal feedback, the drawbacks are the same as in trapezoidal MOPAs. In addition, laterally homogeneous reflection by the front facet causes unnecessarily high losses into the non-pumped part of the trapezium.

Furthermore, trapezoidal DBR lasers with spatially limited planar surface gratings as a front reflectivity, used to minimize optical losses due to radiation into the non-pumped part of the trapezium, are known from Bedford et al. "Demonstration of finite-aperture tapered unstable resonator lasers", Applied Physics Letters, Vol. 83, No. 5. Here, mode filtering is necessarily done by a section including a ridge waveguide, which strongly limits the pump surface.

To improve lateral beam quality, it is further known to construct the laser resonator as an external component and integrate a semiconductor laser amplifier (SOA) therein. The drawbacks of this hybrid structure are, however, the very high adjustment accuracy of the optical elements (<1 μm), the poor mechanical and thermal stability and the complex manufacturing process.

The object of the present invention is therefore to provide a diode laser and a laser resonator for a diode laser, which has high lateral beam quality at high power output, requires little adjustment effort and is inexpensive to produce. Furthermore, the diode laser according to the invention is intended to deliver high lateral beam quality without using an external resonator.

DESCRIPTION OF THE INVENTION

According to the invention, these objects are achieved by means of the features set out in patent claim 1. Preferred embodiments of the invention are described in the sub-claims.

The idea of the invention is to make a suitable selection of the different grating widths of the Bragg reflectors (so-called "DBR mirror" or also "distributed Bragg reflector") arranged on the facets of the resonator, in order to influence the propagation factors of individual lateral modes in such a manner that lateral modes of higher order(s) than the fundamental lateral mode are suppressed in such a manner that they cannot achieve stable laser operation. It has been found that the variation of the ratio of the grating widths of the Bragg reflectors arranged on the facets of the resonator results in a different modulation of individual propagation factors of lateral modes (also dependent on the resonator length and the dimensions and materials of the waveguide and the gain section), so that a suitable selection of the ratio of the grating widths serves to significantly increase the intensity of the fundamental lateral mode, compared to higher-order lateral modes, thus significantly increasing lateral beam quality. In this way, it is especially possible to realize a structurally simple diode laser (resonator) having high lateral beam quality since there is no need to use curved facets, curved Bragg reflectors or external resonators, even at very high power. Furthermore, there is no need to use a ridge waveguide for mode selection arranged between the facets (Bragg reflectors) since mode selection can be adjusted via the ratio of the grating widths, thus advantageously making available a larger pump surface. In other words, no ridge waveguide is arranged in the area between the first Bragg reflector and the second Bragg reflector.

According to one aspect of the invention, a laser resonator for a laser diode is disclosed, comprising: a gain section, a first planar Bragg reflector and a second planar Bragg reflector, wherein the gain section is arranged between the first planar Bragg reflector and the second planar Bragg reflector and wherein the entire gain section has a gain-guided design and the width of the first planar Bragg reflector differs from the width of the second planar Bragg reflector. The ratio of the width of the second planar Bragg reflector to the width of the first planar Bragg reflector is preferably between 1.5 and 20. The gain section is preferably formed by exactly one (continuous) gain section. As an alternative, it is possible to divide the gain section into several sub-sections into which charge carriers are injected via separate contacts in each case. In case of several sub-sections, each of these sub-sections has a gain-guided (rather than index-guided) design.

The fact that the entire gain section has a gain-guided (rather than index-guided) design is understood in the present application according to the definition disclosed in M. Ueno and H. Yonezu: "Guiding mechanisms controlled by impurity concentrations—(Al,Ga)As planar stripe laser with deep Zn diffusion", J. Appl. Phys. 51 (5) pp. 2361-2371 (1980). In this document, the areas of gain guiding and index guiding are defined as a function of a parameter D:

$$D = \frac{\Delta\alpha}{2k_0\Delta n} \text{ wherein } k_0 = \frac{2\pi}{\lambda_0}\text{(vacuum wavelength)}$$

Index guiding is referred to as "normal guiding", which according to M. Yamada: "Transverse and Longitudinal Mode Control in Semiconductor Injection Lasers", J. Quant. Electron. QE-19 (9) pp. 1365-1380 (1983), p. 1368, table 1, is equivalent to the term "index guiding". The criterion for gain guiding is that the value of D is larger than 1. For a typical value of the gain loss difference, $\Delta\alpha=10\ cm^{-1}$, for high-power diode lasers and a typical vacuum wavelength of $\lambda_0=1\ \mu m$, the resulting leap (difference) of the effective indices is $\Delta n<1.5\times 10^{-4}$. This can be realized by not etching at all or only doing a sufficiently flat etching (preferably keeping a distance of min. 500 nm from the active layer) on the side of the contact.

In contrast to the gain section of the present invention, gain sections formed by ridge waveguides are index-guided. Here, trenches are etched down into the waveguide layer. The consequential index leap results in lateral (perpendicular to the direction of propagation and to the direction of epitaxial growth) wave guiding in the non-etched (in most cases electrically pumped) area between the trenches. This means, the grooves extend in the direction of propagation in ridge waveguides, and perpendicular to said direction in Bragg reflectors.

The Bragg reflectors consist of grating grooves with straight (i.e. non-curved) edges along an axis perpendicular to the direction of propagation of light, parallel to the plane of the epitaxial layers. Preferably, the edges of the grating grooves are also straight along an axis perpendicular to the direction of propagation of light and perpendicular to the plane of the epitaxial layers.

Preferably, the first planar Bragg reflector is arranged on a first base side of the gain section and the second planar Bragg reflector is arranged on the opposing base side of the gain section. In other words, the first planar Bragg reflector is arranged (at least partly) within the (upper) waveguide layer, wherein the first planar Bragg reflector is preferably in direct contact with the first (i.e. the broader) base side of the gain section in the area of the waveguide. Furthermore, the second planar Bragg reflector is also arranged (at least partly) within the (upper) waveguide layer, wherein the second planar Bragg reflector is preferably in direct contact with the second (i.e. the narrower) base side of the gain section in the area of the waveguide. The active layer preferably extends over the entire component, but is electrically pumped via electrical contacts only in the gain section. Direct contact of the Bragg reflector and the base side of the gain section means therefore that the Bragg reflector and the electrical contact are in contact along an axis perpendicular to the layers or that the Bragg reflector and the projection of the electrical contact into the plane of the Bragg reflector along an axis perpendicular to the layers overlap. As an alternative, it is also possible to remove the active layer below the gratings (in a projection along said perpendicular axis) to minimize absorption losses.

A trapezoidal shape of the gain section is preferred but not an essential requirement. However, a widening towards the front facet is preferred due to the divergence of light. Trumpet-shaped geometries are possible as well. Rectangular contact surfaces are also possible although widening contact surfaces are preferred.

The ratio of the width of the second planar Bragg reflector to the width of the first planar Bragg reflector is preferably in the range between 1.5 and 20, more preferably in the range between 3 and 10 and even more preferably in the range between 3 and 9.

A Bragg reflector is a grating with a periodic variation of the refractive index between two values and along the longitudinal axis of the resonator, wherein the period length and refractive indices are selected in such a manner that the central wavelength of the Bragg reflector is within the amplification spectrum of the gain section.

The gain section preferably has a trapezoidal design, wherein lateral wave guiding is preferably realized in a gain-guided manner. Gain guiding is based on the lateral variation of the gain by means of a laterally inhomogeneous distribution of the charge carriers. No lateral leap is incorporated in the real part of the refractive index for wave guiding ($\Delta n\approx 0$). Preferably, the first planar Bragg reflector is arranged on a first end of the gain section and the second planar Bragg reflector is arranged on a second end of the gain section, wherein the second end of the gain section is located opposite the first end. The gain section and the waveguide layers preferably consist of a semiconducting material. The planar Bragg reflectors are preferably arranged within the upper waveguide layer, seen from the substrate, in each case. If the Bragg reflectors are etched into the previously processed layers of the resonator as surface gratings, the Bragg reflectors extend over at least a part of the upper waveguide layer, the cladding layer and the contact layer in each case. If the Bragg reflectors are formed as an integrated grating, simultaneously with or during the application of the individual resonator layers in each case, they are located only within one of the waveguide layers. These integrated gratings preferably extend over a partial area of the upper waveguide layer.

The facets are preferably provided with an anti-reflection coating adapted to the specific laser wavelength of the gain section, so that only the Bragg reflectors influence the reflection of the lateral laser modes within the resonator.

The trapezoidal gain section preferably tapers from the first end (exit facet) towards the second end. Preferably, the trapezoidal gain section tapers continuously from the first end (exit facet) towards the second end. According to the invention, the gain section need not be strictly trapezoidal, i.e. designed with planar edges. As an alternative, it is possible that the side surfaces have a non-planar design. However, the gain section as a whole is preferably designed as an exact trapezium.

The first planar Bragg reflector preferably has a lower reflectivity than the second planar Bragg reflector (in the area of the exit facet). The width of the second planar Bragg reflector is preferably the same as the width of the gain section in the area of the second end.

The diode laser according to the invention comprises the resonator according to the invention, which has at least one of the aforesaid features. The ratio of the width of the first planar Bragg reflector to the width of the second planar Bragg reflector (taking into account the resonator length and the dimensions and materials of the waveguide layers) is preferably selected in such a manner that the ratio of the propagation factor of the fundamental lateral mode to the propagation factor of the first-order lateral mode (or all propagation factors of higher-order lateral modes) is larger than 5, preferably larger than 8, more preferably larger than 10 and even more preferably larger than 11.

For the purpose of the present invention, a ridge waveguide is a section of the waveguide, which has different widths along a vertical axis.

According to another aspect of the invention, a laser resonator for a laser diode comprises a gain section, a first planar Bragg reflector and a second planar Bragg reflector, wherein the gain section has a trapezoidal design and the first planar Bragg reflector is arranged on a first base side of the trapezoidal gain section and the second planar Bragg reflector is arranged on the opposing base side of the trapezoidal gain section, wherein the width of the first planar Bragg reflector differs from the width of the second planar Bragg reflector.

Preferably, the gain section as a whole has a trapezoidal design. The ratio of the width of the second planar Bragg reflector to the width of the first planar Bragg reflector is preferably between 1.5 and 20. The Bragg reflectors are preferably designed as surface gratings having grating grooves with completely straight edges along an axis perpendicular to the direction of propagation of light and parallel to the plane of the waveguide layers of the resonator. The Bragg reflectors are preferably designed as an internal grating with completely straight edges along an axis perpendicular to the direction of propagation of light and parallel to the plane of the waveguide layers of the resonator. The laser resonator preferably comprises a first facet on the outer end of the first Bragg reflector and a second facet on the outer end of the second Bragg reflector. Preferably, no ridge waveguide is arranged in the area between the first Bragg reflector and the second Bragg reflector. The first facet and/or the second facet preferably have a planar design. Preferably, the first facet and/or the second facet have a reflection of less than 1% for the specific laser wavelength of the gain section. Preferably, the first facet and/or the second facet have a reflection of less than 0.1% for the specific laser wavelength of the gain section. The trapezoidal gain section preferably tapers from the first end towards the second end. The first planar Bragg reflector preferably has a lower reflectivity for the specific laser wavelength of the gain section than the second planar Bragg reflector. The width of the second planar Bragg reflector is preferably the same as the width of the gain section in the area of the second end. The first planar Bragg reflector and/or the second planar Bragg reflector are preferably formed by means of a periodic variation of the refractive index between two values and along the longitudinal axis of the resonator, wherein the period length and refractive indices are selected in such a manner that the central wavelength of the Bragg reflector is within the amplification spectrum of the gain section. The Bragg reflectors preferably comprise grating grooves with straight edges along an axis perpendicular to the direction of propagation of light and perpendicular to the plane of the waveguide layers. Preferably, the first planar Bragg reflector and the second planar Bragg reflector are arranged at least partly within one of the waveguide layers of the resonator. The laser resonator preferably consists of exactly two Bragg reflectors.

According to another aspect of the invention, a diode laser is disclosed comprising a laser resonator having at least one of the features mentioned above, wherein electrical contacts for injecting electrical charge carriers into the gain section are provided. Preferably, the entire gain section has a gain-guided design. According to another aspect of the invention, the diode laser is used without an additional, external resonator for the production of laser radiation.

SHORT DESCRIPTION OF THE FIGURES

The invention will now be explained in more detail with reference to exemplary embodiments illustrated in the figures, in which.

DETAILED DESCRIPTION OF THE FIGURES

Figure 1:
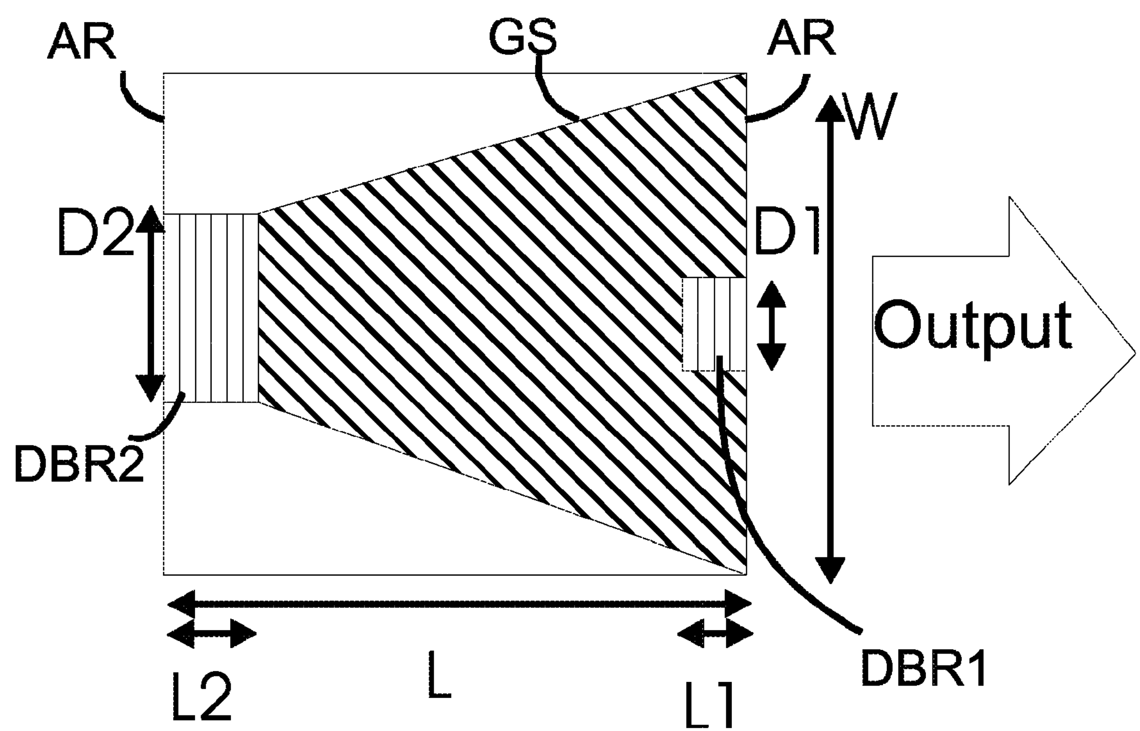
FIG. 1 shows a schematic plan view of a resonator according to the invention.

FIG. 1 shows a schematic view of a resonator according to the invention according to a preferred embodiment variant of the invention. The optical resonator (of a high-power laser diode according to the invention) is formed by two planar Bragg reflectors DBR1 and DBR2 of different widths $D_1$ and $D_2$, between which an electrically pumped, trapezoidal gain section GS is located. The facets AR are provided with a high-performance anti-reflection coating. Output takes place on the facet at DBR1.

Unstable resonators including curved mirrors are well known in the state of the art. According to the invention, however, planar Bragg mirrors are used instead of curved mirrors to form the unstable resonator. If planar gratings are used as reflectors, the technological problems caused by the use of curved Bragg gratings or curved facets are avoided. It has been found that the use of planar Bragg mirrors of different widths (and preferably of the same grating constant and the same material) results in higher lateral beam quality, provided a suitable width ratio is selected.

According to the invention, the wave fronts are made to curve by diffraction on the planar, spatially limited mirrors, rather than by means of curved mirrors.

Figure 2:
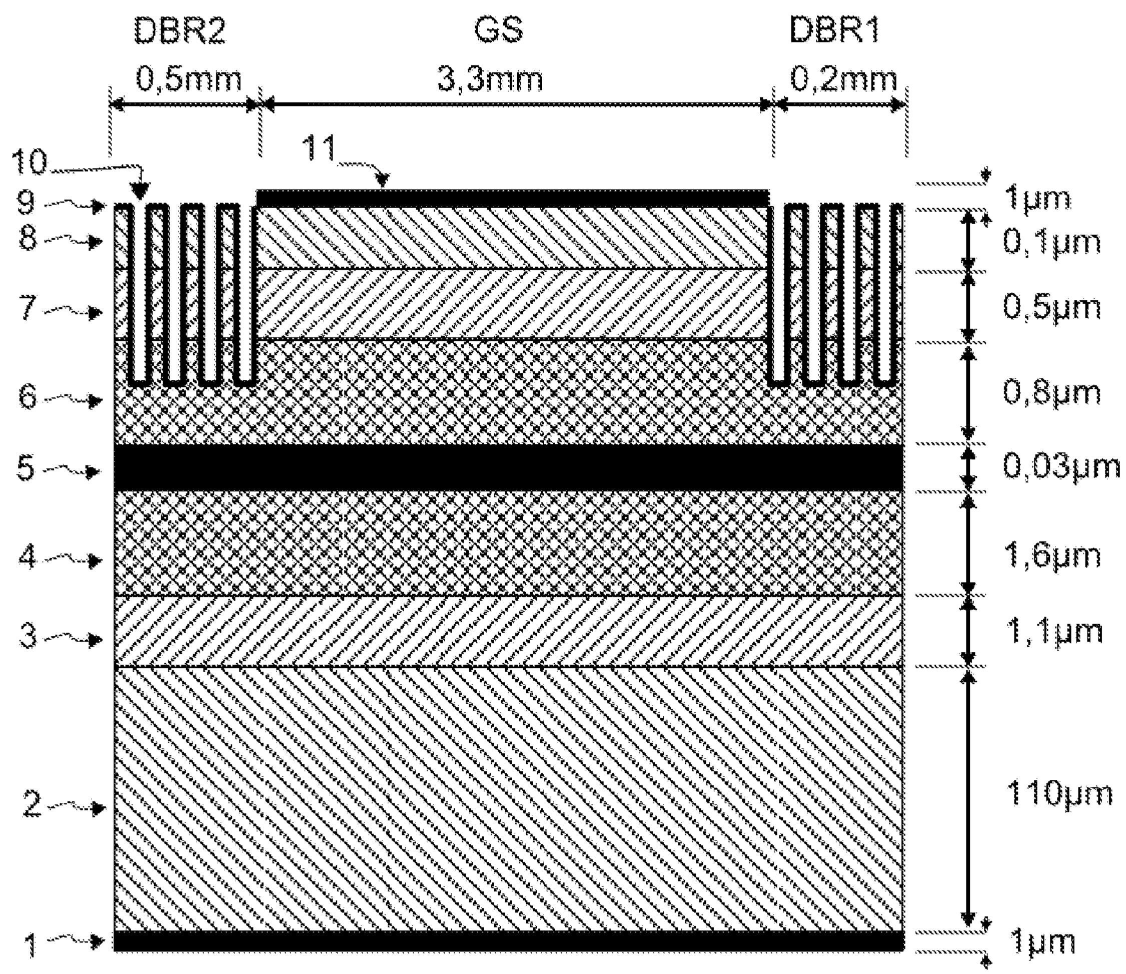
FIG. 2 shows a schematic sectional view of a resonator according to the invention according to a first embodiment variant.
Figure 3:
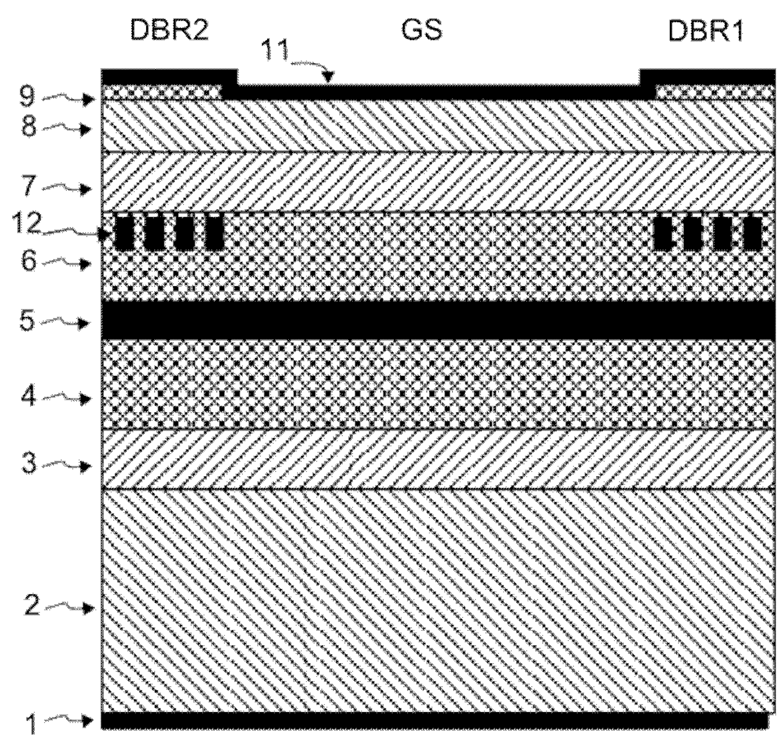
FIG. 3 shows a schematic sectional view of a resonator according to the invention according to a second embodiment variant.

FIGS. 2 and 3 show sectional views of different, preferred embodiment variants of a resonator according to the invention.

An n-cladding layer 3, an n-waveguide 4, an active layer 5, a p-waveguide 6, a p-cladding layer 7, a contact layer 8 and one insulator 9 in each of the areas of the gratings DBR1 and DBR2 are applied to a substrate 2 one after the other. The preferred materials can be seen in the list of reference numerals; the preferred layer thicknesses can be seen in FIGS. 2 and 3. Furthermore, an n-metallization 1 is applied to the bottom side of the substrate 2 and a p-metallization 11 is applied, for the purpose of making contact. If the Bragg reflectors DBR1 and DBR2 are etched into the previously processed layers 2 to 8 of the resonator as surface gratings 10 (FIG. 2), the grating grooves of the Bragg reflectors DBR1 and DBR2 extend over at least a part of the upper waveguide layer 6, the cladding layer 7 and the contact layer 8 in each case. According to the invention, the edges of the grating grooves of the Bragg reflectors DBR1 and DBR2 have a completely planar design. At least, the edges of the grating grooves must be designed to be completely straight along an axis perpendicular to the direction of propagation of light and parallel to the plane of the waveguide layers 4, 6. The same is true of the edges of the internal gratings 12 in FIG. 3. In this embodiment variant, the Bragg reflectors DBR1 and DBR2 are formed as an integrated grating 12 during the application of the individual waveguide layer 6 and extend within the waveguide layer 6 with straight edges.

Particularly preferred dimensions are:

| | | |
|---|---|---|
| L = 4 mm | L = 6 mm | L = 8 mm |
| W = 200 μm | W = 250 μm | W = 500 μm |
| D1 = 20 μm | D1 = 20 μm | D1 = 20 μm |
| D2 = 75 μm | D2 = 90 μm | D2 = 165 μm |
| L1 = 200 μm | L1 = 200 μm | L1 = 500 μm |
| L2 = 500 μm | L2 = 1000 μm | L2 = 1000 μm |

In general, the following ratios are preferred: L1/L2 is preferably between 0.1 and 1.0 and more preferably between 0.2 and 0.5. D2/D1 is preferably between 2 and 20 and more preferably between 3 and 9. L/L1 is preferably between 10 and 40 and more preferably between 15 and 30. In general, the following dimensions are preferred: L1 is preferably between 100 μm and 1000 μm and more preferably between 200 μm and 500 μm. L2 is preferably between 200 μm and 2000 μm and more preferably between 500 μm and 1000 μm. L is preferably between 2 mm and 10 mm and more preferably between 4 mm and 8 mm. D2 is preferably between 10 μm and 50 μm and more preferably between 15 μm and 25 μm. D1 is preferably between 50 μm and 250 μm and more preferably between 75 μm and 165 μm.

Figure 4:
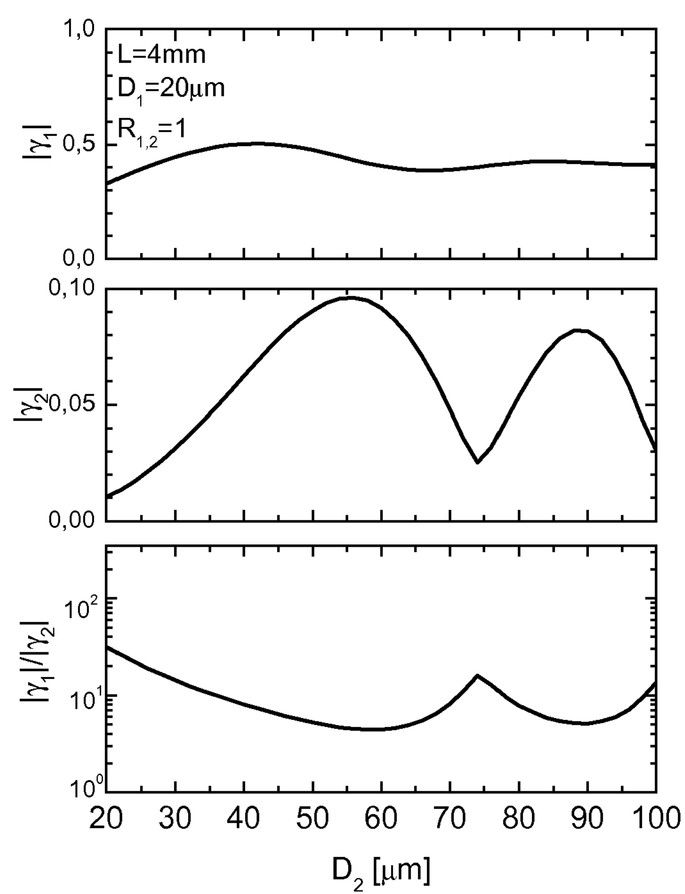
FIG. 4 shows the dependence of the propagation factors of the fundamental lateral mode and of the first-order lateral mode on the width ratio of the Bragg reflectors used in the resonator.

FIG. 4 shows a numerical simulation of an unstable resonator with planar gratings, in particular: a) the dependence of the propagation factor of the fundamental lateral mode on the rear grating width $D_2$, b) the dependence of the propagation factor of the first-order lateral mode on the rear grating width $D_2$, and c) the dependence of mode discrimination on the rear grating width $D_2$, at a wavelength of 1060 nm, a resonator length of 4 mm and a rear grating width $D_2$ of 20 μm in each case. The reflectivities of the gratings DBR1 and DBR2 were assumed to be R=1 in each case.

The numerical simulations demonstrate that the propagation factors are modulated, thus also modulating modal losses of the transversal resonator modes, if the rear grating width $D_2$ is varied. As the maximums and minimums of the losses of the individual modes occur at different grating widths $D_1$, $D_2$, increased mode discrimination in such a manner that higher-order lateral modes are suppressed more strongly can be achieved, provided the grating widths and resonator length are properly selected.

The optimum ratio of $D_2/D_1$ depends on the resonator length and on the wavelength of the light in the resonator. As an analytical approach to the resonator simulation is not possible for spatially limited mirrors, the optimum ratio of $D_2/D_1$ can be obtained by means of a numerical resonator simulation. For the characteristic, preferred dimensions of high-power diode lasers (length: 0.5 to 10 mm), the ratio of $D_2/D_1$ is preferably in the range between 1.5 and 20, more preferably in the range between 3 and 10 and even more preferably in the range between 3 and 7. For the preferred realization of a 4 mm-long laser at a wavelength of 1 μm, it is preferred that $D_2$=75 μm and $D_1$=20 μm.

In contrast to the present invention, MOPAs are not based on unstable resonators but on single-lateral-mode operation of the master oscillator. This is achieved by the small lateral width of the ridge waveguide. Due to the larger pump surface and the lower electrical series resistance and thermal resistance associated therewith, the present invention can achieve significantly higher power, compared to trapezoidal MOPAs of the same length. In addition, the problems caused by optical feedback into the master oscillator are avoided in the present invention.

In trapezoidal lasers, one section of the laser resonator consists of a narrow ridge waveguide as a mode filter. Likewise, mode filtering in the trapezoidal DBR lasers known from Bedford et al. "Demonstration of finite-aperture tapered unstable resonator lasers", Applied Physics Letters, Vol. 83, No. 5 is based on the use of a ridge waveguide section, so that a larger pump surface is available in the diode laser according to the present invention.

LIST OF REFERENCE NUMERALS

GS Gain section
DBR1 First planar Bragg reflector
DBR2 Second planar Bragg reflector
D1 Width of the first planar Bragg reflector
D2 Width of the second planar Bragg reflector
L1 Length of the first planar Bragg reflector
L2 Length of the second planar Bragg reflector
W Width of the front aperture
L Overall length of the laser resonator
AR Facet
1 n-metallization
2 Substrate (e.g. GaAs)
3 n-cladding layer (e.g. AlGaAs)
4 n-waveguide (e.g. GaAs)
5 Active zone (e.g. multiple quantum trenches InGaAs/GaAs)
6 p-waveguide (e.g. GaAs)
7 p-cladding layer (e.g. AlGaAs)
8 Contact layer (e.g. GaAs)
9 Insulator (e.g. SiN)
10 Bragg reflector: surface grating
11 p-metallization
12 Bragg reflector: internal grating (e.g. GaAsP)

The invention claimed is:

1. A laser resonator for a laser diode, comprising:

a gain section, a first planar Bragg reflector and a second planar Bragg reflector, wherein the gain section is arranged between the first planar Bragg reflector and the second planar Bragg reflector and wherein the width of a first portion of the gain section contacting the first planar Bragg reflector is larger than the width of a second portion of the gain section contacting the second planar Bragg reflector, wherein the entire gain section has a gain-guided design, and the width of the first planar Bragg reflector is smaller than the width of the first portion, wherein the width of the second portion is larger than the width of the first planar Bragg reflector and wherein the ratio of the width of the second planar Bragg reflector to the width of the first planar Bragg reflector is between 1.5 and 20.

2. The laser resonator of claim 1, wherein the ratio of the width of the second planar Bragg reflector to the width of the first planar Bragg reflector is between 3 and 10.

3. The laser resonator of claim 1, wherein the gain section is divided into several sub-sections.

4. The laser resonator of claim 1, wherein the Bragg reflectors are designed as surface gratings having grating grooves with completely straight edges along an axis perpendicular to the direction of propagation of light and parallel to the plane of the waveguide layers of the resonator.

5. The laser resonator of claim 1, wherein the Bragg reflectors are designed as an internal grating with completely straight edges along an axis perpendicular to the direction of propagation of light and parallel to the plane of the waveguide layers of the resonator.

6. The laser resonator of claim 1, wherein the laser resonator comprises a first facet on the outer end of the first Bragg reflector and a second facet on the outer end of the second Bragg reflector.

7. The laser resonator according to claim 6, wherein the first facet and/or the second facet has/have a planar design and/or a reflection of less than 1% for the specific laser wavelength of the gain section.

8. The laser resonator of claim 1, wherein the gain section tapers from the first end towards the second end.

9. The laser resonator according to claim 8, wherein the first planar Bragg reflector has a lower reflectivity for the specific laser wavelength of the gain section than the second planar Bragg reflector.

10. The laser resonator of claim 1, wherein the width of the second planar Bragg reflector is the same as the width of the gain section in the area of the second end.

11. The laser resonator of claim 1, wherein the first planar Bragg reflector and/or the second planar Bragg reflector is/are formed by means of a periodic variation of the refractive index between two values and along the longitudinal axis of the resonator, wherein the period length and refractive indices are selected in such a manner that the central wavelength of the Bragg reflector is within the amplification spectrum of the gain section.

12. The laser resonator of claim 1, wherein the Bragg reflectors comprise grating grooves with straight edges along an axis perpendicular to the direction of propagation of light and perpendicular to the plane of the waveguide layers.

13. The laser resonator of claim 1, wherein the first planar Bragg reflector and the second planar Bragg reflector are formed at least partly within one of the waveguide layers of the resonator.

14. The laser resonator of claim 1, wherein the laser resonator consists of exactly two Bragg reflectors.

15. A diode laser, comprising:

a laser resonator having a gain section, a first planar Bragg reflector and a second planar Bragg reflector, wherein the gain section is arranged between the first planar Bragg reflector and the second planar Bragg reflector and wherein the width of a first portion of the gain section contacting the first planar Bragg reflector is larger than the width of a second portion of the gain section contacting the second planar Bragg reflector, wherein the entire gain section has a gain-guided design, wherein the width of the second planar Bragg reflector is larger than the width of the first planar Bragg reflector and wherein the ratio of the width of the second planar Bragg reflector to the width of the first planar Bragg reflector is between 1.5 and 20 and wherein the width of the first planar Bragg reflector is smaller than the width of the first portion; and electrical contacts for injecting electrical charge carriers into the gain section.

16. The diode laser according to claim 15, wherein the entire gain section is gain-guided.

* * * * *